(12) United States Patent
Chou et al.

(10) Patent No.: US 9,510,474 B2
(45) Date of Patent: Nov. 29, 2016

(54) SOLID STATE DRIVE (SSD) ASSEMBLY METHOD

(71) Applicants: Peter Leekuo Chou, Orange, CA (US); Stephen Chien, Irvine, CA (US); William Tai, Irvine, CA (US)

(72) Inventors: Peter Leekuo Chou, Orange, CA (US); Stephen Chien, Irvine, CA (US); William Tai, Irvine, CA (US)

(73) Assignee: KINGSTON TECHNOLOGY COMPANY, Fountain Valley, CA (US)

( * ) Notice: Subject to any disclaimer, the term of this patent is extended or adjusted under 35 U.S.C. 154(b) by 265 days.

(21) Appl. No.: 14/090,907

(22) Filed: Nov. 26, 2013

(65) Prior Publication Data
US 2015/0146364 A1 May 28, 2015

(51) Int. Cl.
H05K 7/14 (2006.01)
(52) U.S. Cl.
CPC .................... H05K 7/142 (2013.01)
(58) Field of Classification Search
CPC ........ H05K 3/36; H05K 3/363; H05K 3/368; H05K 7/142
See application file for complete search history.

(56) References Cited

U.S. PATENT DOCUMENTS

| | | | | |
|---|---|---|---|---|
| 3,835,531 A * | 9/1974 | Luttmer | ............... | H05K 3/4614 174/263 |
| 3,971,610 A * | 7/1976 | Buchoff | ................. | G04C 3/005 174/254 |
| 4,050,756 A * | 9/1977 | Moore | ................... | G04G 17/06 174/254 |
| 4,240,198 A * | 12/1980 | Alonso | .............. | H01R 13/2414 29/876 |
| 5,216,807 A * | 6/1993 | Yoshizawa | ............ | H01L 21/486 174/262 |
| 5,477,426 A * | 12/1995 | Bethurum | ............ | G06K 19/077 235/380 |
| 6,493,233 B1 * | 12/2002 | De Lorenzo | ........... | H05K 3/325 174/138 G |
| 6,923,882 B2 * | 8/2005 | Iwamoto | ................. | B32B 27/04 156/235 |
| 7,034,223 B2 * | 4/2006 | Fan | ......................... | G06F 1/184 174/138 G |
| 2008/0266816 A1 | 10/2008 | Ni et al. | | |

* cited by examiner

Primary Examiner — Carl Arbes
(74) Attorney, Agent, or Firm — Law Offices of S.J. Christine Yang

(57) ABSTRACT

A solid state drive (SSD) assembly and an assembly method for solid state drives, which does not require using screws. The assembly method includes aligning a printed circuit board with a first cover and a second cover, the first cover having pre-installed standoffs on an inner surface thereof. The printed circuit board and the second cover respectively having a first set of through-holes, and the first set of through-holes correspond to the standoffs. The assembly method further includes placing the printed circuit board between the first and second covers, thereby exposing an end portion of each of the standoffs in the through-holes of the second cover, and deforming the end portion of each of the standoffs about the through-holes, thereby fastening the first and second covers with one another.

11 Claims, 6 Drawing Sheets

SOLID STATE DRIVE (SSD) ASSEMBLY METHOD

BACKGROUND OF THE INVENTION

Field of the Invention

The present invention relates generally to a solid state drive assembly and an assembly method for solid state drives, and, more specifically, to a solid state drive assembly and an assembly method for solid state drives that does not require screws.

Discussion of the Related Art

A solid-state drive (SSD) is a data storage device that utilizes solid-state memory (e.g., non-volatile memory or synchronous dynamic access memory (SDRAM) volatile memory) to store data. A SSD is also known as a solid-state drive, even though it does not contain an electromechanical magnetic 'disk' or motors to 'drive' disks like a conventional hard disk drive (HDD).

As the conventional HDDs have mechanical moving parts, the conventional HDDs have slower memory data access. In contrast, SSDs have no moving mechanical components. Compared to the conventional HDDs, SSDs typically are more resistant to physical shock, run more quietly, have lower access time, have improved electro-magnetic-interference (EMI), and have less latency.

A SSD generally includes a printed circuit board assembly (PCBA) within a metallic housing. FIG. 1 is an exploded illustration of a SSD according to the related art. In FIG. 1, a SSD 10 according to the related art includes a PCBA 12, which is inside a housing. The housing comprises an upper cover 14a and a lower cover 14b. The upper cover 14a, the bottom cover 14b and the PCBA 12 respectively have a first set of corresponding through-holes 15a. Further, the lower cover 14b and the PCBA 12 respectively have a second set of corresponding through-holes 15b.

Memories 16 are provided on the PCBA 12. The PCBA 12 is affixed onto the lower cover 14b by tightening screws 18a into the second set of through-holes 15b. With the PCBA 12 affixed onto the lower cover 14b, the housing is then closed by affixing together the upper and lower covers 14a and 14b by tightening screws 18b into the first set of through-holes 15a. Therefore, the assembly of the SSD according to the related art requires a large number of screws and labors for tightening the screws.

Moreover, the screws inside the SSD housing according to the related art occupy space. The resulting SSD according to the related art therefore is not thin. Thus, there exists a need for an assembly method that avoids the use of screws and remains simple, effective and efficient to securely hold the PCBA within a housing.

SUMMARY OF THE INVENTION

Accordingly, embodiments of the invention are directed to an assembly method for solid state drives that can substantially obviate one or more of the problems due to limitations and disadvantages of the related art.

An object of embodiments of the invention is to provide an assembly method for solid state drives that does not require screws for tightening the housing.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, a method according to an embodiment of the present invention includes installing standoffs protruding from an inner surface of a first cover, aligning a printed circuit board with the first cover and a second cover, the printed circuit board and the second cover respectively having a first set of through-holes, and the first set of through-holes correspond to the standoffs, placing the printed circuit board between the first and second covers, thereby exposing an end portion of each of the standoffs in the through-holes of the second cover, and deforming the exposed portion of each of the standoffs about the through-holes, thereby fastening the first and second covers with one another and securing the printed circuit board therein.

A method according to another embodiment of the present invention includes aligning a printed circuit board with a first cover and a second cover, the first cover having standoffs on an inner surface thereof, the printed circuit board and the second cover respectively having a first set of through-holes, and the first set of through-holes correspond to the standoffs, placing the printed circuit board between the first and second covers, thereby exposing an end portion of each of the standoffs in the through-holes of the second cover, and deforming the end portion of each of the standoffs about the through-holes, thereby fastening the first and second covers with one another.

A hardware assembly according to another embodiment of the present invention includes a housing, and a non-volatile solid state drive having an Input/Output interface within the housing, wherein the housing is affixed together by rivets.

It is to be understood that both the foregoing general description and the following detailed description are exemplary and explanatory, which are intended to provide further explanation of embodiments of the invention as claimed.

BRIEF DESCRIPTION OF THE DRAWINGS

The accompanying drawings, which are included to provide a further understanding of embodiments of the invention and are incorporated herein constituting a part of this specification, illustrate embodiments of the invention and together with the description serve to explain the principles of embodiments of the invention.

DETAILED DESCRIPTION OF THE PREFERRED EMBODIMENTS

Reference will now be made in detail to the preferred embodiments of the invention, examples of which are illustrated in the accompanying drawings.

Figure 1:
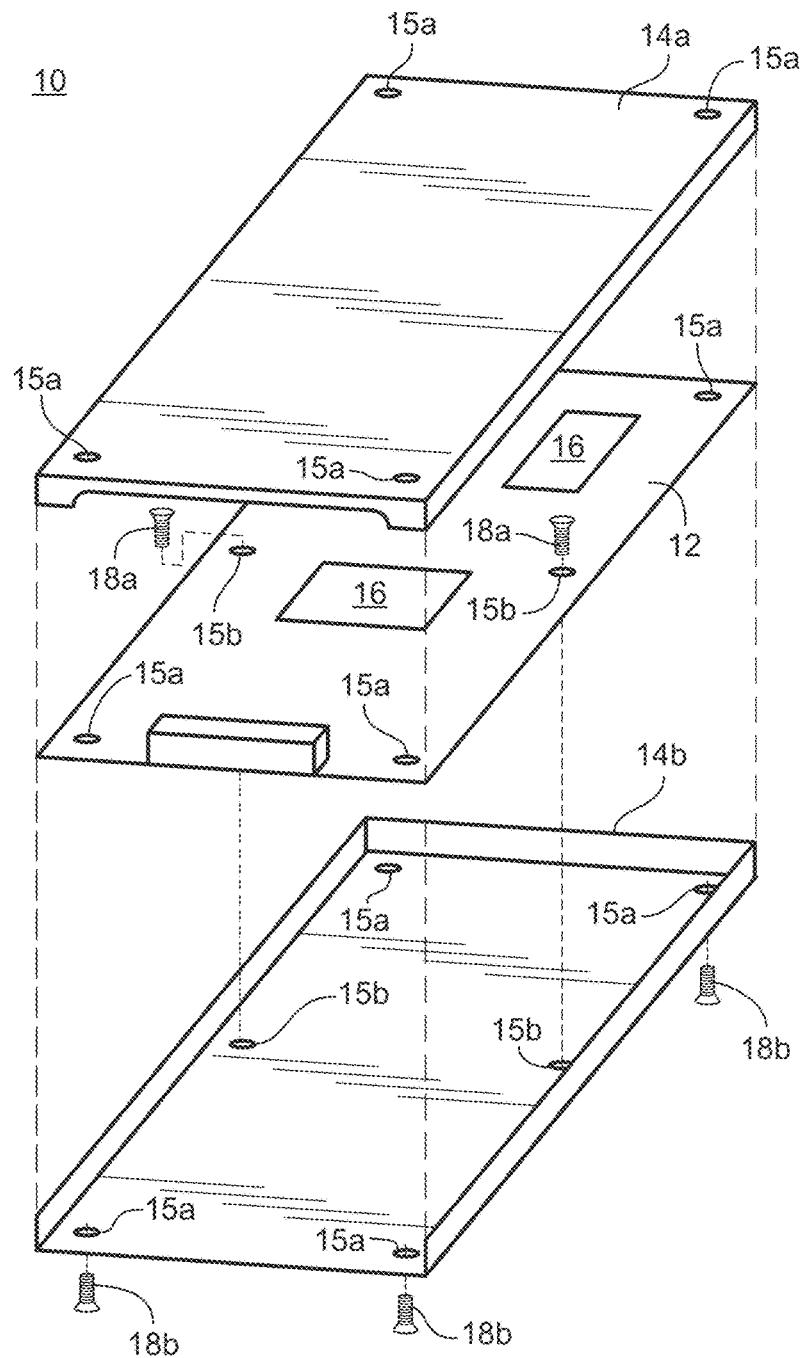
FIG. 1 is an exploded illustration of a SSD according to the related art.
Figure 2:
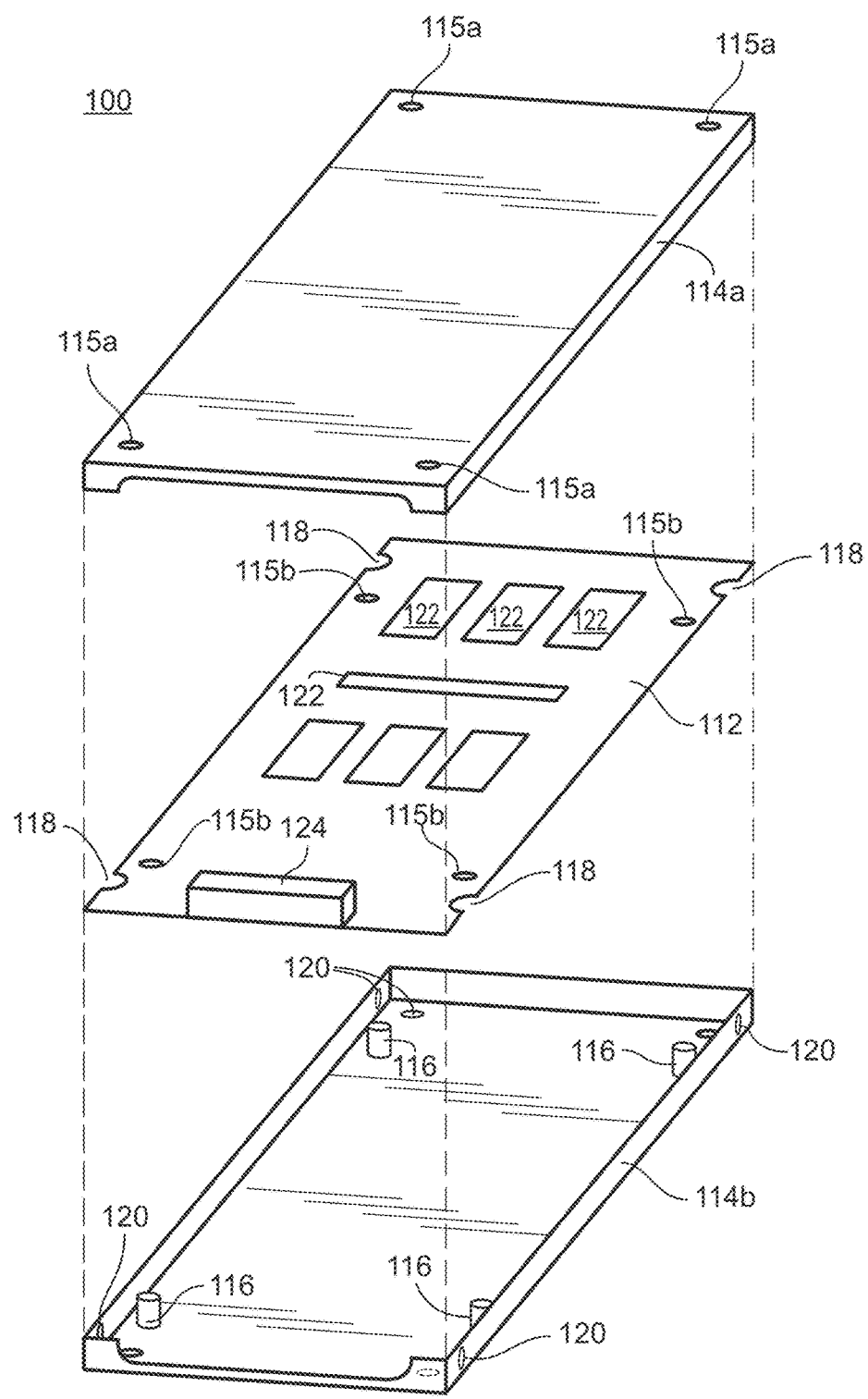
FIG. 2 is an exploded illustration of a SSD according to an embodiment of the present invention.

FIG. 2 is an exploded illustration of a SSD according to an embodiment of the present invention. In FIG. 2, a SSD 100 includes a PCBA 112 and a housing. The housing includes an upper cover 114a and a lower cover 114b. The upper cover 114a and the PCBA 112 respectively have a set of corresponding through-holes 115a and 115b. The through-holes 115b in the PCBA 112 may be flush or uniform through-holes. On the other hand, the through-holes 115a in the upper cover 114a preferably are not flush or uniform through-holes but rather step-down ridges on the exterior surface of the upper cover 114a.

The lower cover 114b includes a set of standoffs 116 at locations corresponding to the set of through-holes 115a and 115b in the upper cover 114a and the PCBA 112. The height of the standoffs 116 is high enough to protrude through the through-holes 115a and 115b in the upper cover 114a and the PCBA 112. Further, the height of the standoffs 116 preferably to substantially align with the middle ridge of the through-hole 115a in the upper cover 114a and not be higher than or extend beyond the exterior surface of the upper cover 114a.

The upper cover 114a may include SPCC (cold rolled steel), SECC (steel, electrogalvanized, cold-rolled, coil) or aluminum and have the same material as the lower cover 114b. For example, the material of the upper cover 114a has density range of about 2.68-8 g/cc and has an electrical resistivity between about 0.00000499~0.000170 ohm-cm. The upper cover 114a may be formed using a stamping processing.

Alternatively, the upper cover 114a may include acylonitrile butadiene styrene (ABS) plastic or polycarbonate (PC) plastic. The plastic material of the upper cover 114a has density range of about 0.35-1.54 g/cc and has an electrical resistivity between about 1.00e+5~1.0e+1.8 ohm-cm. The upper cover 114a may be formed using a molding processing.

The lower cover 114b may include SPCC (cold rolled steel), SECC (steel, electrogalvanized, cold-rolled, coil) or aluminum. Preferably, the material of the lower cover 114b has density range of about 2.68-8 glee and has an electrical resistivity between about 0.00000499~0.000170 ohm-cm. The lower cover 114b may be formed using a stamping processing.

The standoffs 116 may include a malleable metallic material, such as steel, aluminum, iron, titanium or an alloy thereof. Preferably, the material of the standoffs 116 has the same or substantially the same density range and electric resistivity as the lower cover 114b. For example, the material of the standoffs 116 may have density range of about 2.68-8 g/cc and has an electrical resistivity between 0.00000499~0.000170 ohm-cm. The standoffs 116 may have varying diameters and the smallest diameter may be about 0.5 mm.

Figure 3:
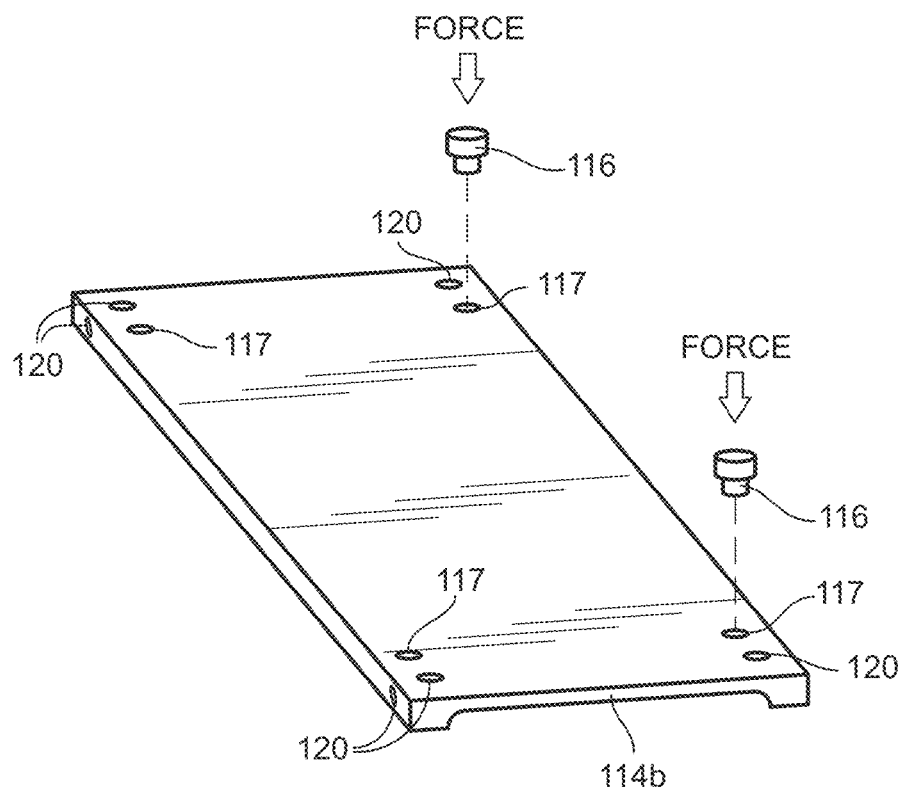
FIG. 3 is an illustration of the lower cover and standoffs shown in FIG. 2.

The standoffs 116 may be pre-installed onto the lower cover 114b. As shown in FIG. 3, prior to the standoffs 116 installed onto the lower cover 114b, the lower cover 114b may include through-holes 117. The standoffs 116 are formed separately from the lower cover 114b. The standoffs 116 may have spiked surfaces in its base. With the exterior surface of the lower cover 114b facing up, the standoffs 116 are aligned to the through-holes 117 and pushed into the through-holes 117. For example, the lower cover 114b may be placed onto a stamping or punching station and the standoffs 116 may be loosely placed in the through-holes 117. Subsequently, the stamping or punching station can push even the widest portion of the standoffs 116 into the through-holes 117. In particular, due to the force and speed of the stamping punching station and the spiked surface of the standoffs 116 base, the lower cover 114b may be forced to be deformed and the spiked surface of the standoffs 116 base are wedged around the through-holes 117.

As shown in FIG. 2, the PCBA 112 further has a set of cut-away 118. The cut-away 118 may be along edges of the PCBA 112. The cut-away 118 correspond to a set of holes 120 in the lower cover 114b. During operation, the assembled SSD 100 may be mounted onto a host platform. The cut-away 118 and the holes 120 in the lower cover 114b provide the clearance for mounting means to be mounted onto a host platform. Some of the holes 120 may be on the side surface of the lower cover 114b.

One or more memory modules and other electronic components 122 are on the PCBA 112. Also, an input/output (I/O) interface 124 for ultimately interfacing with a host device (not shown) is on the PCBA 112. The I/O interface 124 may be a SATA connector, another standardized connector, or a propriety connector designed for a particular host device (not shown).

To assemble the SSD 100, the PCBA 112 is placed inside the upper and lower covers 114a and 114b. The PCBA 112 is positioned so that the through-holes 115a and 115b in the upper cover 114a and the PCBA 112 are aligned and the standoffs 116 protrude through the through-holes 115a and 115b. Also, the cut-away 118 and the holes 120 in the lower cover 114b are aligned. By doing so, the standoffs 116 would protrude through the through-holes 115a and 115b in the upper cover 114a and the PCBA 112, and over the exterior surface of the upper cover 114a.

After the PCBA 112 is properly placed inside the upper and lower covers 114a and 114b, it may be placed with the upper cover 114a facing up on a punching station. The punching station (not shown) includes a number of punching posts. The number of the punching posts preferably matches the number of the standoffs 116. The ends of the punching posts are tiered. During operation, the punching station lowers the punching posts with certain predetermined force to punch and deform the standoffs 116. The pressure or force range of the punching onto the standoffs 116 preferably is about 200-300 kg per punch. Further, the punching may be rotational or include a torque.

Due to the tiered ends of the punching posts and/or the torque in the punching, the previously protruded portion of the standoffs 116 deforms around the ridges of the through-hole 115a in the upper cover 114a. The deformed standoffs 116' therefore function as rivets. Alternatively, the punching of the standoffs 116 may be performed manually.

Figure 4A:
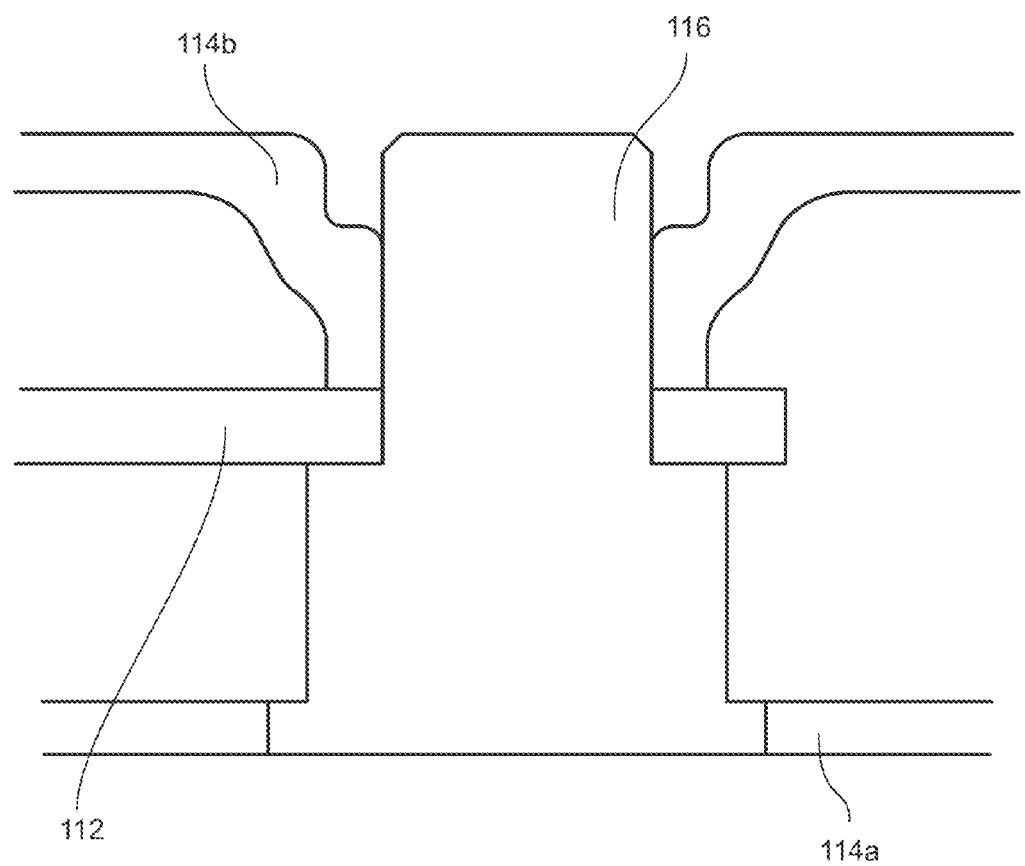
FIG. 4a is an exploded cross-sectional illustration of one of the standoff's protruding through the through-hole in the upper cover shown in FIG. 2.
Figure 4B:
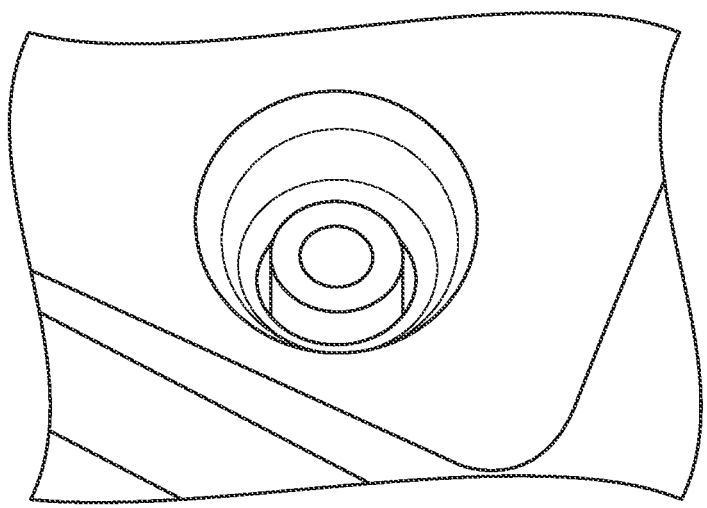
FIG. 4b is a detailed illustration of standoffs used in an assembly method for a SSD according to an embodiment of the present invention.
Figure 4C:
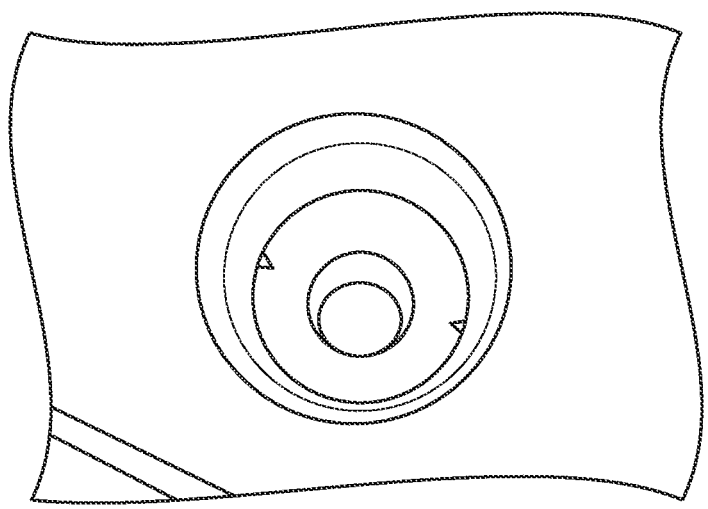
FIG. 4c is a detailed illustration of deformed standoffs in an assembly method for a SSD according to an embodiment of the present invention.

FIG. 4a is an exploded cross-sectional illustration of the standoff protruding through the through-hole in the upper cover shown in FIG. 2. FIG. 4I) is a detailed illustration of standoffs used in an assembly method for a SSD according to an embodiment of the present invention, and FIG. 4c is a detailed illustration of deformed standoffs in an assembly method for a SSD according to an embodiment of the present invention. As shown in FIGS. 4a and 4b, the standoffs 116 protrude through the through-holes 115a in the upper cover 114a. More specifically, the height of the standoffs 116 preferably to substantially align with the middle ridge of the through-hole 115a in the upper cover 114a and not be higher than or extend beyond the exterior surface of the upper cover 114a.

As shown in FIG. 4c, after punching, the previously protruded portion of the standoffs 116 deforms around the ridges of the through-hole 115a in the upper cover 114a. The deformed standoffs 116' therefore function as rivets.

Figure 5:
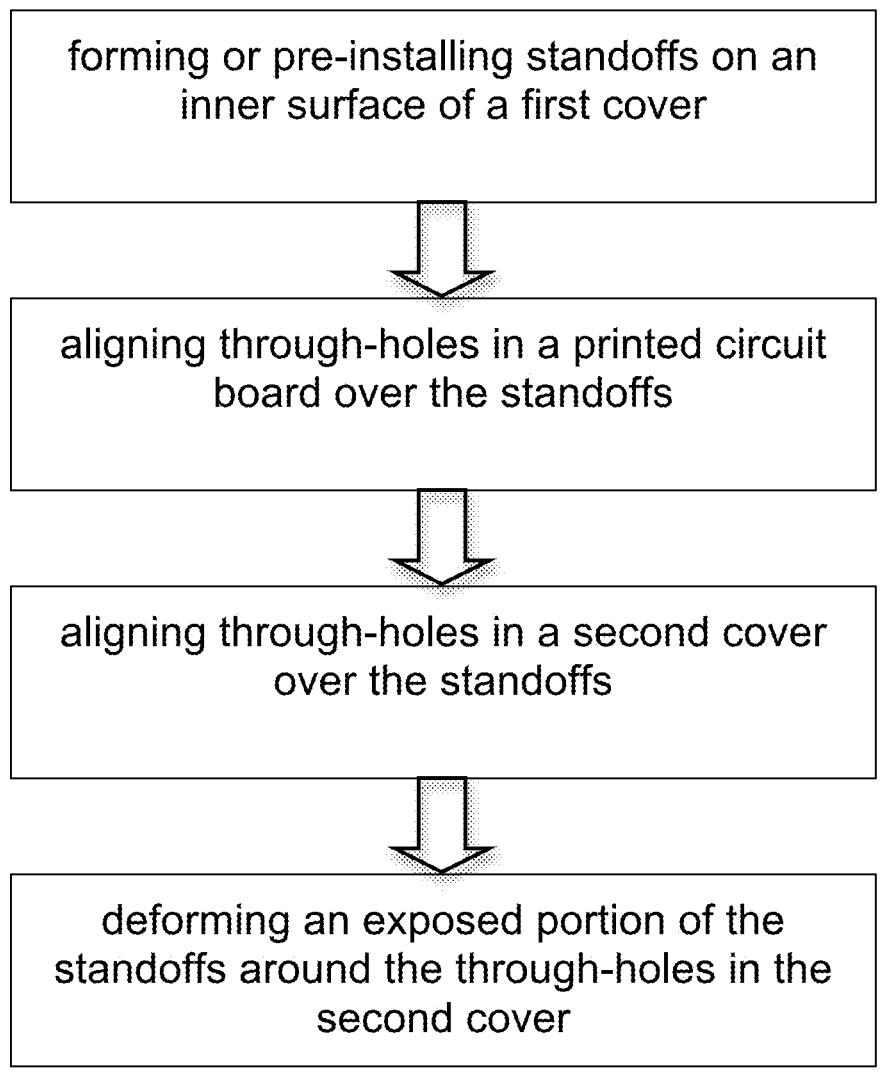
FIG. 5 is a flow chart illustrating the steps of an assembly method for a SSD according to an embodiment of the present invention.

FIG. 5 is a flow chart illustrating the steps of an assembly method for a SSD according to an embodiment of the present invention. In FIG. 5, an assembly method for SSDs includes forming or pre-installing standoffs on an inner surface of a first cover. The assembly method further includes the step of aligning through-holes in a printed circuit board over the standoffs. One or more non-volatile memory modules and other electronic components may be on the printed circuit board. Subsequently, the assembly method includes the step of aligning through-holes in a second cover over the standoffs. Then, the method includes the step of deforming an exposed portion of the standoffs around the through-holes in the second cover. The step of deforming may include applying uniaxial compression onto an end surface of each of the standoffs while torquing the pressing posts.

It will be apparent to those skilled in the art that various modifications and variations can be made in the SSD assembly and an assembly method for SSDs of embodiments of the invention without departing from the spirit or scope of the invention. Thus, it is intended that embodiments of the invention cover the modifications and variations of this invention provided they come within the scope of the appended claims and their equivalents.

What is claimed:

1. A method, comprising:
   installing standoffs protruding from an inner surface of a first cover;
   aligning a printed circuit board with the first cover and a second cover, the printed circuit board and the second cover respectively having a first set of through-holes, and the first set of through-holes correspond to the standoffs;
   placing the printed circuit board between the first and second covers, thereby exposing an end portion of each of the standoffs in the through-holes of the second cover; and
   deforming the exposed portion of each of the standoffs about the through-holes, thereby fastening the first and second covers with one another and securing the printed circuit board therein,
   wherein the step of deforming the end portion of each of the standoffs includes:
      using a pressing post, the post having a tiered end; and
      applying uniaxial compression onto an end surface of each of the standoffs while torquing the pressing posts.

2. The method of claim 1, wherein the step of installing the standoffs includes:
   pushing the standoffs into through-holes of the first cover from the exterior surface of the first cover.

3. The method of claim 1, wherein the first cover includes a metal material or metallic alloy and has electrical resistivity of about 4.99e−6 to 1.70e−4 ohm-cm or density range of about 2.68-8 g/cc.

4. The method of claim 1, wherein the second cover includes a metal material or metallic alloy and has electrical resistivity of about 4.99e−6 to 1.70e−4 ohm-cm or density range of about 2.68-8 g/cc.

5. The method of claim 1, wherein the second cover includes a plastic material.

6. The method of claim 1, wherein the standoffs include at least one of steel, aluminum, iron, titanium and alloy.

7. A method, comprising:
   aligning a printed circuit board with a first cover and a second cover, the first cover having standoffs on an inner surface thereof, the printed circuit board and the second cover respectively having a first set of through-holes, and the first set of through-holes correspond to the standoffs;
   placing the printed circuit board between the first and second covers, thereby exposing an end portion of each of the standoffs in the through-holes of the second cover; and
   deforming the end portion of each of the standoffs about the through-holes, thereby fastening the first and second covers with one another,
   wherein the step of deforming the end portion of each of the standoffs includes:
      using a pressing post, the post having a tiered end; and
      applying uniaxial compression onto an end surface of each of the standoffs while torquing the pressing posts.

8. The method of claim 7, wherein the first cover includes a metal material or metallic alloy and has electrical resistivity of about 4.99e−6 to 1.70e−4 ohm-cm or density range of about 2.68-8 g/cc.

9. The method of claim 7, wherein the second cover includes a metal material or metallic alloy and has electrical resistivity of about 4.99e−6 to 1.70e−4 ohm-cm or density range of about 2.68-8 g/cc.

10. The method of claim 7, wherein the second cover includes a plastic material.

11. The method of claim 7, wherein the standoffs include at least one of steel, aluminum, iron, titanium and alloy.

* * * * *